United States Patent
Uesaka

(10) Patent No.: US 7,978,741 B2
(45) Date of Patent: Jul. 12, 2011

(54) OPTICAL TRANSMITTER WITH A SHUNT DRIVING CONFIGURATION AND A LOAD TRANSISTOR OPERATED IN COMMON GATE MODE

(75) Inventor: Katsumi Uesaka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 910 days.

(21) Appl. No.: 11/808,559

(22) Filed: Jun. 11, 2007

(65) Prior Publication Data

US 2007/0291807 A1    Dec. 20, 2007

(30) Foreign Application Priority Data

Jun. 14, 2006  (JP) .................................. 2006-165171
Nov. 29, 2006  (JP) .................................. 2006-322315

(51) Int. Cl.
    *H01S 3/00*      (2006.01)
(52) U.S. Cl. ............... 372/38.02; 372/38.07; 372/38.01; 372/38.04
(58) Field of Classification Search ............... 372/38.02, 372/38.07, 38.01
    See application file for complete search history.

(56) References Cited

U.S. PATENT DOCUMENTS

| | | | |
|---|---|---|---|
| 6,091,449 A * | 7/2000 | Matsunaga et al. | 348/308 |
| 6,333,623 B1 * | 12/2001 | Heisley et al. | 323/280 |
| 6,522,114 B1 * | 2/2003 | Bakker et al. | 323/282 |
| 6,618,408 B1 | 9/2003 | Mader et al. | |
| 7,026,655 B2 * | 4/2006 | Go et al. | 257/81 |
| 2006/0088071 A1 * | 4/2006 | Hovakimyan | 372/38.02 |

FOREIGN PATENT DOCUMENTS

| | | |
|---|---|---|
| JP | 5-315686 | 11/1993 |
| JP | 2003-163547 | 6/2003 |
| JP | 2005-033019 | 2/2005 |

OTHER PUBLICATIONS

Notification of Reasons of Rejection.

* cited by examiner

Primary Examiner — Kinam Park
(74) Attorney, Agent, or Firm — Smith, Gambrell & Russell, LLP

(57) ABSTRACT

The invention provides an optical transmitter that prevents the high frequency components in the driving signal from leaking to the external power supply in a wider frequency range. The transmitter provides a shun driving configuration with a switching transistor connected in parallel to the laser diode and a load transistor connected in serial to the parallel circuit of the switching transistor and the laser diode. The load transistor operates in the common base configuration, or the common gate configuration, by which the input impedance viewed from the laser diode becomes large, while, the output impedance viewed from the external power source becomes small. Thus, the high frequency components in the driving signal applied to the switching transistor can be suppresses to appear in the external power source.

7 Claims, 5 Drawing Sheets

OPTICAL TRANSMITTER WITH A SHUNT DRIVING CONFIGURATION AND A LOAD TRANSISTOR OPERATED IN COMMON GATE MODE

BACKGROUND OF THE INVENTION

1. Field of the Invention

The present invention relates to an optical transmitter for driving a semiconductor laser diode (hereafter denoted as LD), in particular, the invention relates to an optical transmitter with an active load to the laser diode.

2. Related Prior Art

The U.S. Pat. No. 7,026,655, has disclosed an optical transmitting module with the shunt-driving circuit installed within the CAN-type package. Because of their small-sized package, the optical transmitter with the CAN package has been often combined with the shunt-driving circuit. In the shunt-driving circuit, the LD is connected in parallel to a switching transistor and modulated by turning on or off the switching transistor to shunt the current flowing in the LD. The switching of the transistor may be carried out to provide a driving signal with high frequency components to the transistor. When the high frequency components of the driving signal leaks to a power supply to provide a DC current to the LD, the power supply is caused to fluctuate or to be unstable, which degrades the quality of the optical output from the transmitter. In the prior United States Patent described above, an inductor is installed on a power supply line to provide a current from the external power supply to the LD. The inductor reduces the leak of the high frequency components in the external power supply. Thus, the optical output from the transmitter is not deformed.

The inductor, exactly, the impedance of the inductor gradually decreases as the frequency of the signal decreases. Thus, the inductor is hard to prevent the relatively low frequency components from appearing in the external power supply. Moreover, the LD is generally accompanied with an auto-power control (hereafter denoted as APC) function to stabilize the average power of the optical output from the LD. The APC has a feedback function where a portion of the optical output from the LD is monitored by a photodiode (hereafter denoted as PD) to generate a monitoring signal, the monitoring signal is compared with a reference, and the LD is driven such that the monitoring signal becomes substantially equal to the reference. Thus, when a disconnection of the APC feedback loop or a breakdown in devices within the feedback loop occurs, an excess current so as to break the LD may be supplied thereto.

SUMMARY OF THE INVENTION

The present invention relates to an optical transmitter that comprises an LD and a driver. The driver includes a switching transistor and a load transistor. The switching transistor is connected in parallel to the LD to shunt a current to be supplied to the LD by receiving a driving signal from an outside of the transmitter. The load transistor is connected between a power supply and the parallel circuit of the LD and the switching transistor. For a feature of the present invention, the load transistor operates in the common gate mode where the transistor is an FET, while, in the common base mode where the transistor is a bipolar transistor.

The transistor operated in the common gate mode has large output impedance viewed from the drain thereof, while, small input impedance viewed from the source. The drain of the load transistor connects to the LD and the switching transistor, and the source connects to the power supply. Therefore, in the circuit configuration of the present invention, high frequency components contained in the driving signal is hard to appear in the source of the load transistor, which suppresses the infection of the driving signal to the power supply and, accordingly, the degradation in the optical output from the transmitter.

The transmitter of the present invention may include a bias generator within the CAN package to further stabilize the bias applied to the gate of the load transistor, which enhances the common gate operation of the load transistor. Moreover, the transmitter may further provide a switch and a detector. The switch is interposed between the gate of the load transistor and the bias generator, and the detector detects the abnormality of the power supply. When an abnormality is detected, the switch between the gate and the bias generator is turned off, which forces the gate bias to be substantially short-circuited to the source of the load transistor. As a result, the current to be supplied to the LD is cut to prevent the LD from the breakdown. A breaking of the wire or a breakdown of devices within the APC feedback loop may cause the abnormality of the power supply. According to the present invention, even such abnormality may occur, the LD can be reliably protected.

DESCRIPTION OF PREFERRED EMBODIMENTS

Next, preferred embodiments of the present invention will be described as referring to accompanying drawings. In the description of the drawings, the same numerals or symbols will refer to the same elements without overlapping explanations.

First Embodiment

Figure 1:
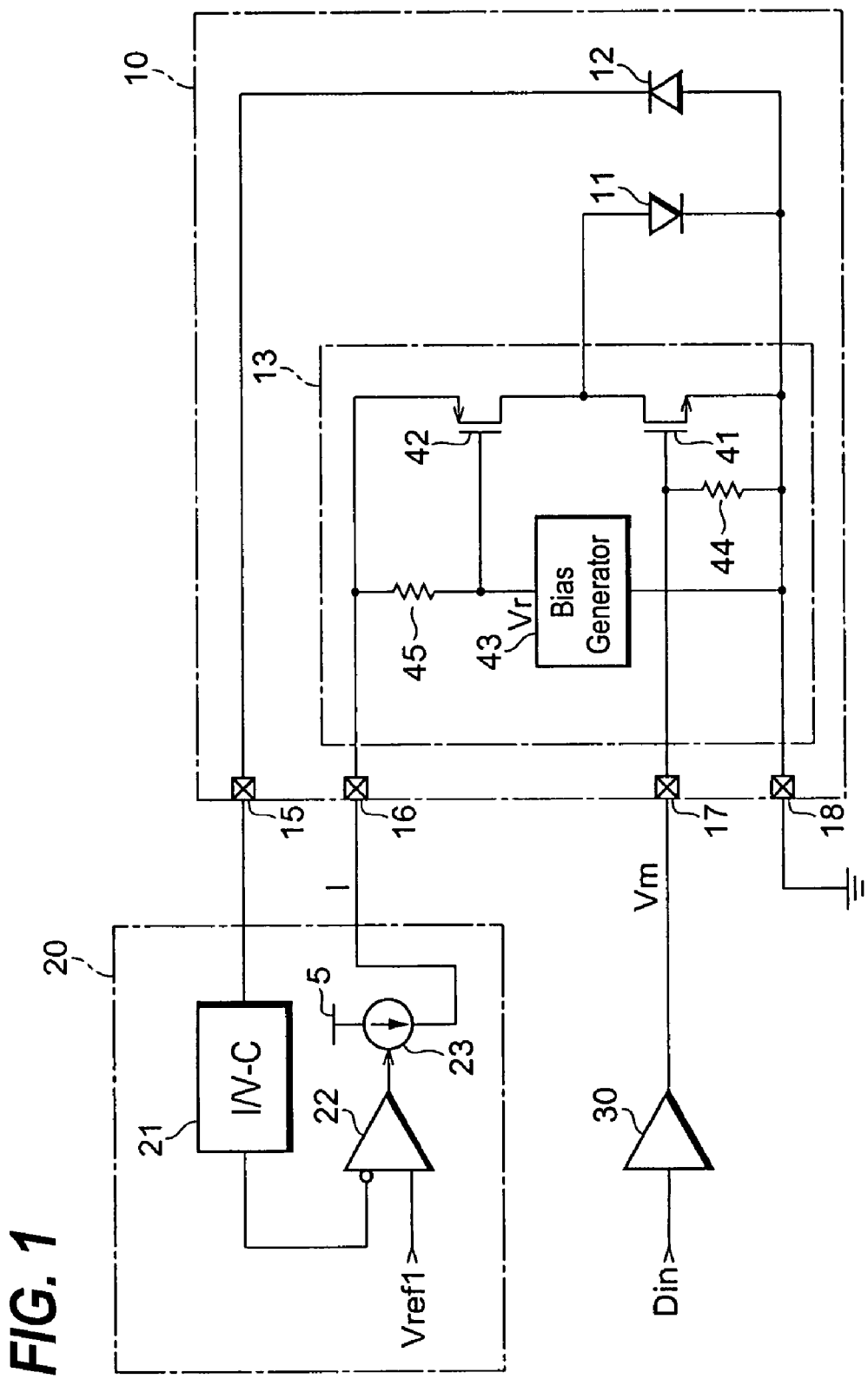
FIG. 1 is a block diagram of an optical transmitter according to a first embodiment of the present invention.

FIG. 1 is a circuit diagram of an optical transmitter 10 according to the first embodiment of the present invention. FIG. 1 illustrates, in addition to the optical transmitter 10, an auto-power control (hereafter denoted as APC) block 20 and a signal driver 30. The optical transmitter 10 includes a semiconductor laser diode (hereafter denoted as LD) 11, a photodiode (hereafter denoted as PD) 12, and a driver 13. The optical transmitter further provides a monitoring terminal 15, a power supply terminal 16, a signal terminal 17 and a ground terminal 18.

The LD 11 is connected to a current source 23 within the APC block 20 through the power supply terminal 16 to be provided with a driving current from the current source 23. The LD 12, by providing the driving current, is able to emit light. The PD 12 monitors the optical power emitted from the LD 11. The PD 12 generates a photocurrent substantially proportional to the optical power emitted from the LD 11. The optical transmitter 10 outputs this photocurrent from the monitoring terminal 15.

The driver 13, not only receives the current I from the APC block 20 but also the driving signal from the signal driver 30 through the signal terminal 17, and switches the current flowing within the LD 11 depending on this driving signal, which makes the LD 11 to emit signal light modulated with the signal.

The APC block 20 controls the current I supplied to the optical transmitter 10 so as to keep the average power of the optical signal output from the optical transmitter 10 based on the photocurrent output from the PD 12. The APC block 20 includes a current-to-voltage converter (hereafter denoted as I/V-C) 21, an error amplifier 22, and a current source 23. The I/V-C 20 converts the photocurrent output by the PD 12 into a voltage signal and outputs this voltage signal to one input terminal of the error amplifier 22. The other input terminal of the error amplifier 22 receives a reference Vref1. The error amplifier outputs a signal corresponding to a difference between the reference Vref1 and the output of the I/V-C that corresponds to the average optical output from the transmitter 1. The current source 23 outputs to the driver 13 the current I corresponding to the difference of the inputs to the error amplifier 22.

The modulation driver 30 generates a driving signal Vm that corresponds to a data Din provided from the outside of the transmitter, and provides thus generated signal Vm to the driver 13. The driver 13 includes two transistors, 41 and 42, a bias generator 43, and two resistors, 44 and 45. In the present embodiment, one of the transistor 41 is an n-type MOSFET, while, the other transistor is a p-type MOSSET.

The first transistor 41 modulates the LD 11, that is, the transistor 41 is connected in parallel to the LD 11 with drain and source thereof being connected to the anode and the cathode of the LD 11, respectively. The current I supplied from the current source 23 may be shunted to the LD 11 or the transistor 41 depending on the operation of the transistor 41. The source of the transistor 41, the cathode of the LD 11 and the anode of the PD 12 are grounded through one of the terminal 19.

The gate of the transistor 41 receives the driving signal Vm from the signal driver 30. The resistor 44 connected between the gate of the transistor 41 and the ground is a termination resistor whose resistance is set to be substantially identical with the output impedance of the signal driver 30 to reduce the degradation of the driving signal due to the impedance mismatching.

The transistor 41, as mentioned previously, shunts the current I in accordance with the driving signal. That is, when the driving signal Vm is in the high level, the transistor turns on to flow the most part of the current I from the current source 23 between the drain and the source thereof, which reduces the current flowing in the LD 11 enough and makes the optical signal in the low level. On the other hand, when the driving signal is in the low level, the transistor 41 turns off to cut the current flowing between the drain and the source thereof, which shunts the current I from the current source 23 to the LD 12 to make the optical signal to be in the high level. Thus, the optical signal may reflect the data Din.

Between the drain of the transistor 41 and the power supply terminal 16 is inserted with another transistor 42. This second transistor 42 in the drain thereof is connected to the anode of the LD 11 and the drain of the first transistor 41. The source of the second transistor 42 is connected to the power supply terminal 16. A resistor 45 is provided between the gate of the transistor 42 and the power supply terminal 16, which biases the gate of the transistor 42. During the operation of the first transistor 41, the transistor 42 turns on by receiving the bias to the gate from the power supply terminal 16 through the resistor 45 and the bias generator 43. The bias generator 43 generates a bias Vr that is provided to the gate of the second transistor 42, which stabilizes the gate of the transistor 42 and grounds in the AC mode.

Figure 2:
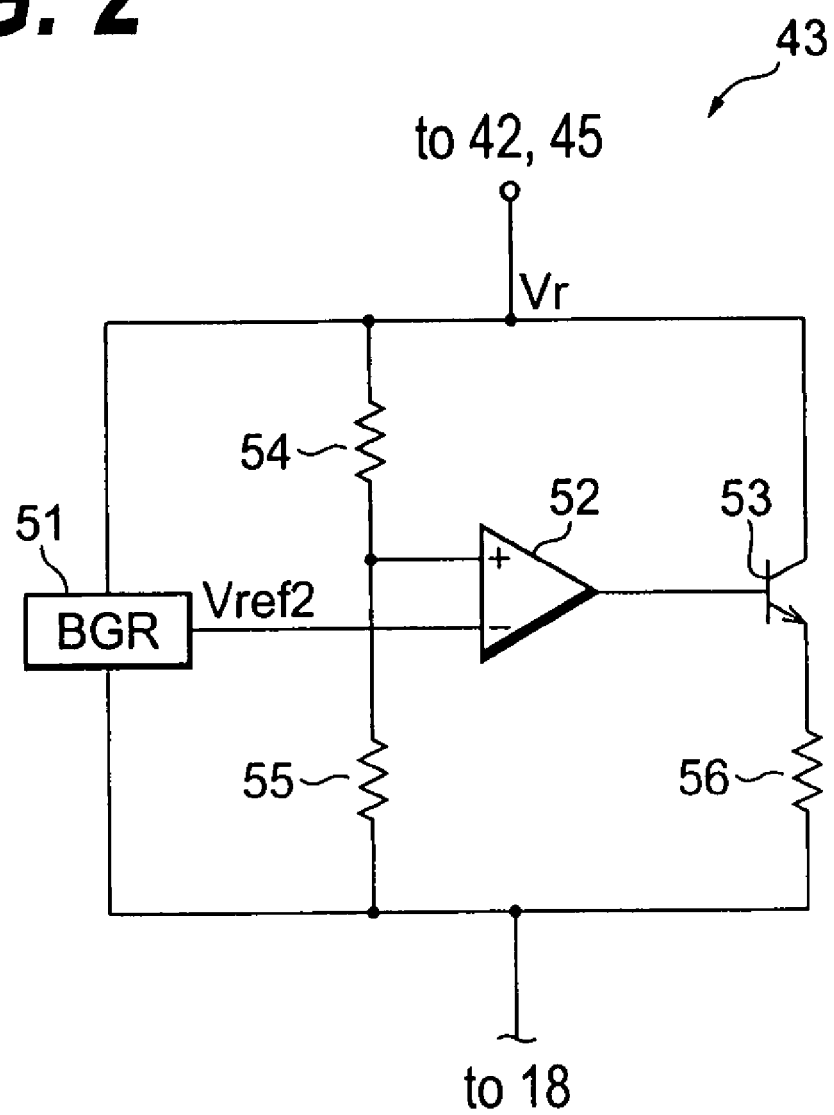
FIG. 2 is a circuit diagram of a bias generator included in the optical transmitter shown in FIG. 1.

FIG. 2 is an example of the bias generator 43, which is a type of the shunting regulator including a band gap reference generator (hereafter denoted as BGR) 51, an error amplifier 52, a third transistor 53 and resistors, 54 to 56. Two resistors, 54 and 55, are connected in series between the output terminal of the bias generator and the ground terminal 18.

The inverting input of the error amplifier receives a reference Vref2 output from the BGR 51, while, the non-inverting input thereof receives a signal relating to the output Vr, namely, the signal divided by the resistors, 54 and 55, connected in serial to each other.

Because the collector of the transistor 53 is connected to the output terminal of the bias generator 43 and the source thereof is grounded, the transistor 53, the resistive divider of two resistors, 54 and 55, and the error amplifier 52 constitute a negative feedback loop to keep the output Vr constant value determined by the reference Vref2. Even when the ambient temperature or the APC block 20 causes a fluctuation of the potential at the power supply terminal, the bias generator 43 keeps the output Vr thereof constant by adjusting the current flowing in the transistor 53 and accordingly the potential drop by the resistor 45.

The emitter resistor 56 may prevent the saturation in the output of the error amplifier 52 and reduce the closed loop gain of the feedback circuit including the error amplifier 52, the transistor 53 and the resistive divider. This emitter resistor 56 may be removed when the error amplifier 52 does not saturate in the output thereof and the feedback loop becomes stable.

Advantages of the present invention will be described. The second transistor 42 inherently provides, similar to the general transistor, an internal resistor, which is regarded to be inserted between the drain of the first transistor 41 and the power supply terminal 16. This internal resistor may isolate the power supply terminal 16 and the current source 23 from the driving signal Vm input to the first transistor 41. Different from an inductor, which may also isolate the high frequency component within the driving signal, the resistance of the internal resistor does not vary with respect to frequencies and may suppress the leaking of the high frequency components in the driving signal Vm to the current source 23 in relatively wide frequency ranges. Thus, the optical transmitter 10 may further suppress the degradation in a waveform of the optical output signal.

Because the gate of the second transistor 42 is grounded in the AC mode by biasing with the DC signal Vr from the bias generator, where the second transistor operates in the grounded-base circuit, the input impedance of the transistor 42, namely, the resistance viewed from the source thereof, becomes small while the output impedance viewed from the drain becomes large. Moreover, the present embodiment provides the voltage regulator for the bias generator 43, which may quite stabilize the gate bias. Thus, the input impedance of the second transistor 42 becomes quite small and the output impedance thereof may become quite large. Accordingly, the current I from the power supply terminal 16 to the source of the transistor 42 does not fluctuate because of the small input impedance, while, the current source 23 may be effectively isolated from the driving signal Vm because of the large output impedance at the drain.

The optical transmitter 10 installs the internal bias generator 43, which makes it unnecessary to provide additional terminal for the bias to the gate of the transistor 42. The omission of the terminal results in the small sized package of the transmitter 10 and the reduction of the production cost.

Second Embodiment

Figure 3:
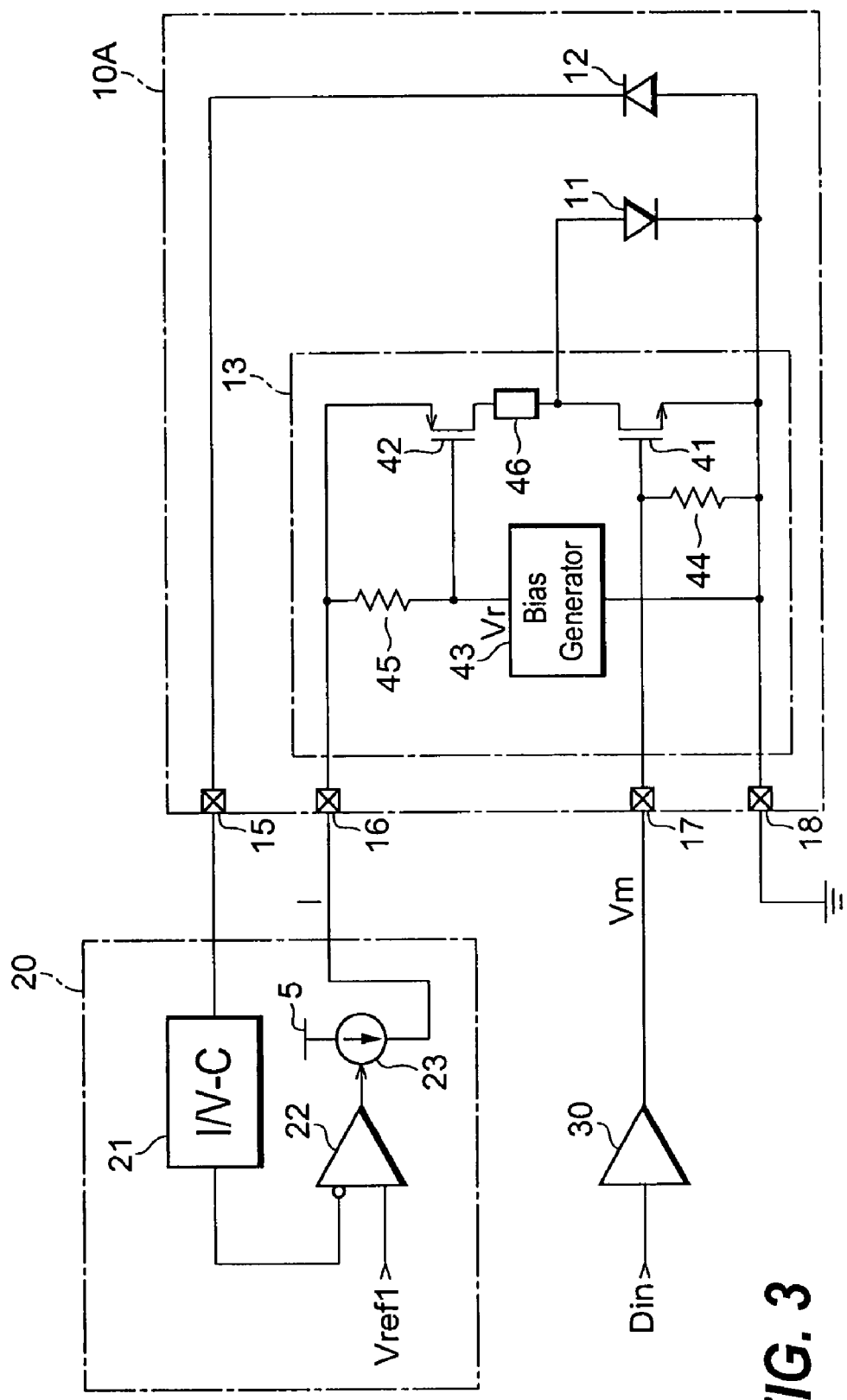
FIG. 3 is a block diagram of an optical transmitter according to a second embodiment of the present invention.

FIG. 3 is a block diagram of an optical transmitter 10A according to the second embodiment of the present invention. This transmitter 10A includes, in addition to elements shown in FIG. 1, an inductor 46 inserted between the drain of the second transistor 42 and the drain of the first transistor 41.

The second transistor 42 inherently provides the parasitic capacitance between the drain and the source thereof, which degrades the isolation between the drain and the source for high frequency components of the driving signal Vm. The impedance of the inductor 46 between the drains of the transistor, 41 and 42, increases as the frequency becomes high, which compensates the degradation in the isolation by the transistor 42 at quite high frequencies. In addition, the inductor 46 may isolate the first transistor 41 from the parasitic capacitance between the drain and the source of the second transistor. Thus, the embodiment shown in FIG. 3 may suppress the high frequency components involved in the driving signal Vm from leaking to the current source in wider frequency regions by the composite impedance of the internal resistor of the transistor 42 with the inductor 46 between the drains.

Third Embodiment

The power detector 47, which is connected to the power supply terminal 16 and the source of the transistor 42, is configured to detect the level V1 at the power supply terminal 16, to compare the level V1 with a reference VTh1, and to control the switch 46 in accordance with the comparison. The detector 47 turns off the switch 46 when the level V1 becomes greater than VTh1, while, it turns on in other cases between the level V1 and the reference Vref2. Thus, the bias of the transistor 42, namely, the voltage difference between the source and the gate of the transistor 42 occasionally becomes substantially zero.

The bias generator 43 in the output Vr thereof is provided to the gate of the transistor 42 through the switch 46. When the switch 46 is turns on, the gate of the transistor 42 may be stabilized in the level Vr, which is the same condition with the case in the first and the second embodiments.

Figure 4:
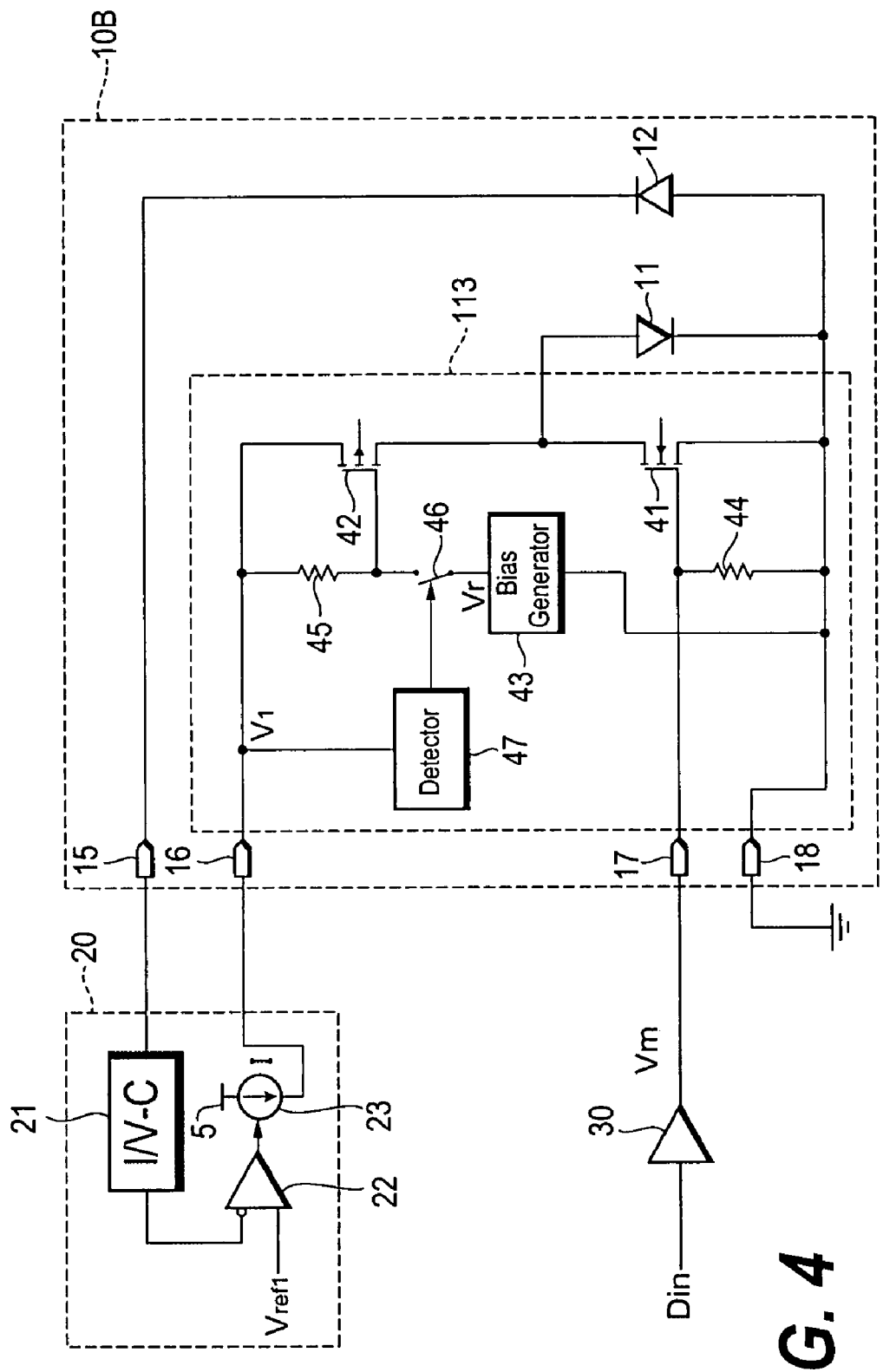
FIG. 4 is a block diagram of an optical transmitter according to a third embodiment of the present invention.

When the level V1 at the power supply terminal 16 becomes large due to some reasons, such as the unstable operation of the APC loop 20, the current flowing in the LD 11 possibly becomes quite large to break the LD 11. In the present embodiment, the detector 47 may turn off the switch 46 when the level V1 becomes greater than a threshold VTh1, which short-circuits the gate to the source to cut the current flowing between the drain and the source. Reasons for the abnormality of the level V1 are, for example, the breakdown of the PD 12 and the open circuit in the APC feedback loop 20. Thus, the present embodiment shown in FIG. 4 may protect the LD 11 from the excess current flowing therein and may secure the safety for the laser operation.

Fourth Embodiment

Figure 5:
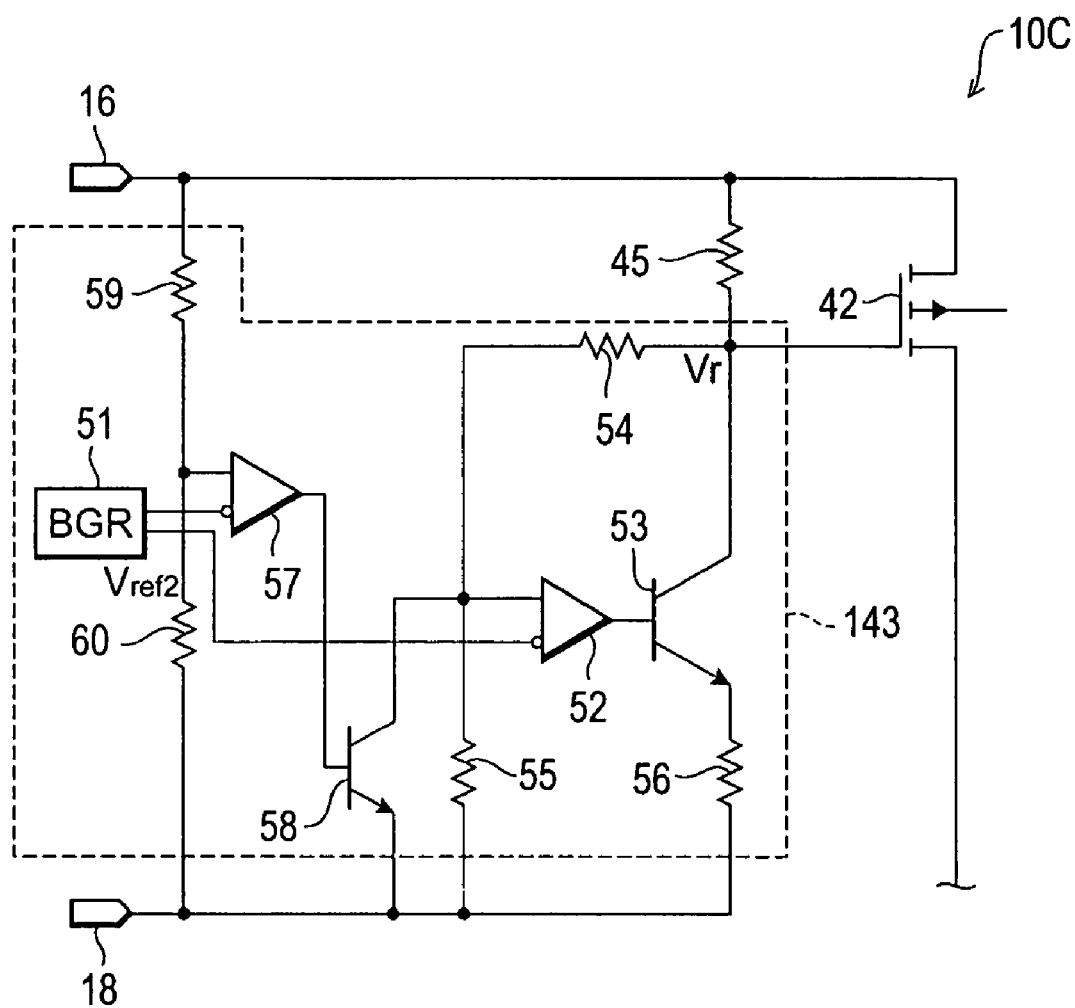
FIG. 5 is a block diagram of an optical transmitter according to a fourth embodiment of the present invention.

Next, the fourth embodiment of the invention will be described. FIG. 5 is a circuit diagram of a primary portion of the optical transmitter 10C according to the fourth embodiment of the invention. This embodiment provides a bias generator 143 with a different configuration from that shown in FIG. 3.

As shown in FIG. 5, the bias generator 143 of the transmitter 10C includes, in addition to the bias generator 43 illustrated in FIG. 2, another error amplifier 57, another transistor 56 and some resistors, 59 and 60. The transistor 58 is connected in parallel to one of the dividing resistor 55 to short-circuit the resistor 58. When this transistor 58 is turned off, which is a normal condition for the operation of the transmitter 10C, the circuit block comprising the error amplifier 52, the transistor 53 and two resistors, 54 and 55, show the same operation as those described in FIG. 2, which stabilizes the gate level of the transistor 42 to be the value Vr determined by the BGR 51 (Vref2) and the resistive dividing circuit, 54 and 55. Even when the level V1 at the power supply terminal 16 varies due the fluctuation of the ambient temperature or the operation of the APC block 20, the bias generator 143 stabilizes the gate level of the transistor 42 by adjusting the current flowing in the resistor 45.

Besides, the bias generator 143 provides two resistors, 59 and 60, connected in series between the power supply terminal 16 and the ground 18. The inverting input of the error amplifier 57 receives the output from the BGR 51; while, the non-inverting input thereof receives a divided level of the power supply terminal 16 by two resistors, 59 and 60. The output of the error amplifier 57 turns on or off the transistor 58 connected in parallel to the resistor 53 depending on the comparison of the output from the BGR with the divided level of the power supply terminal 16.

When the level V1 of the power supply terminal becomes greater due to some reasons such as the out of the feedback loop of the APC block 20 and the dividing level of the power supply terminal 16 exceeds the reference level provided from the BGR 51, the error amplifier 57 turns on the transistor 58, which causes the non-inverting input of error amplifier 52 to be the nearly ground, turns off the transistor 53, accordingly, cuts the current flowing in the resistor 45. Thus, in such occasion where the level of the power supply terminal abnormally increases, the bias generator 143 outputs the bias Vr so as to equivalently short-circuit the gate and the source of the transistor 42, which may cut the current flowing into the LD 12.

The present invention is thus described based on exemplarily shown embodiments. However, the invention is not restricted to those embodiments. For example, although the bias generator provides a voltage regulator comprised of the error amplifier, the transistor and the resistor dividing circuit, another regulator may be applicable as long as it may stabilize the gate level of the transistor connected in serial to the LD to isolate the high frequency components. In a case where the power supply voltage does not drastically change, a simple circuit including only two resistors for the dividing circuit may be applicable, where the gate of the load transistor is connected to an intermediate node of the resistor dividing circuit.

Moreover, the embodiments described above provide a p-type MOSFET as the load transistor to isolate the high frequency components, the load transistor may be a bipolar transistor, and the BGR 51 may be replaced with a circuit of a Zener diode connected in serial to a resistor to generate the reference Vref2. It is therefore intended that the following appended claims be interpreted as including all such alterations, permutations, and equivalents as fall within the true spirit and scope of the present invention.

What is claimed is:

1. An optical transmitter, comprising:
   a driver including,
   a switching transistor connected in parallel to the laser diode to shunt a current supplied to the laser diode from a current source by receiving a driving signal; and
   a laser diode; and
   a load transistor connected between a power supply and a parallel circuit of the laser diode and the switching transistor, the load transistor being operated in grounded-base mode, and
   a bias generator to stabilize a bias voltage applied to a gate of the load transistor,
   wherein the load transistor gives an equivalent resistance to isolate the current source from the driving signal.

2. The optical transmitter according to claim 1,
   wherein the bias generator includes a band gap reference generator, an error amplifier with an inverting input configured to receive an output from the band gap reference generator and a non-inverting input, a transistor configured to receive an output of the error amplifier and to output the bias voltage, and a resistor dividing circuit with an intermediate node for dividing the bias voltage, the non-inverting input of the error amplifier being connected to the intermediate node to receive the divided bias voltage, and
   the error amplifier, the transistor, and the resistor dividing circuit constitute a voltage regulator.

3. The optical transmitter according to claim 1, further comprising
   a CAN package installing the laser diode and the driver, the CAN package providing a terminal of the power supply to provide the current to the load transistor,
   a signal terminal to provide the driving signal to the switching transistor, and
   a ground terminal,
   wherein the bias generator is installed within the CAN package.

4. The optical transmitter according to claim 2, further comprising
   a photodiode installed within the CAN package to monitor an optical output from the laser diode.

5. The optical transmitter according to claim 1, wherein the switching transistor is an n-type FET and a load transistor is a p-type FET.

6. The optical transmitter according to claim 1, wherein the switching transistor is an npn-type bipolar transistor and the load transistor is a pnp-type bipolar transistor.

7. An optical transmitting apparatus, comprising:
   an optical transmitter including,
   a semiconductor laser diode;
   a photodiode for outputting a monitoring signal by monitoring an optical output from the laser diode;
   a switching transistor connected in parallel to the laser diode to shunt a current to be supplied to the laser diode by receiving a driving signal;
   a load transistor connected in serial to the laser diode and to the switching transistor;
   a bias generator to stabilize a bias voltage of the load transistor, the bias generator including a band gap reference generator, an error amplifier, a transistor and a resistor dividing circuit, the error amplifier having an inverting input and a non-inverting input, the inverting input receiving an output from the band gap reference generator, the transistor receiving an output of the error amplifier and outputting the bias voltage, the resistor dividing circuit having an intermediate node for dividing the bias voltage, the non-inverting input being connected to the intermediate node to receive the divided bias voltage; and
   a CAN package for installing the laser diode, the photodiode, the switching transistor, the bias generator, and the load transistor therein, the CAN package providing a signal terminal to provide the driving signal to the switching transistor, a power supply terminal to provide the current to the load transistor, a monitoring terminal to extract the monitoring signal, and a ground terminal; and
   an auto-power control block to generate the current by receiving the monitoring signal such that a magnitude of the monitoring signal becomes substantially equal to a reference,
   wherein the load transistor is operated in a common base mode, grounded-base circuit and gives an equivalent resistance to isolate the auto-power control block from the driving signal.

* * * * *